(12) United States Patent
Zhu et al.

(10) Patent No.: US 8,797,736 B2
(45) Date of Patent: Aug. 5, 2014

(54) CASING AND SERVER USING THE SAME

(75) Inventors: Chong-Xing Zhu, New Taipei (TW); Te-Hsiung Hsieh, New Taipei (TW)

(73) Assignee: Wistron Corporation, New Taipei (TW)

( * ) Notice: Subject to any disclaimer, the term of this patent is extended or adjusted under 35 U.S.C. 154(b) by 175 days.

(21) Appl. No.: 13/541,967

(22) Filed: Jul. 5, 2012

(65) Prior Publication Data
US 2013/0009529 A1 Jan. 10, 2013

(30) Foreign Application Priority Data
Jul. 8, 2011 (CN) .......................... 2011 1 0190795

(51) Int. Cl.
*G06F 1/16* (2006.01)
*G06F 1/18* (2006.01)

(52) U.S. Cl.
CPC ..................................... *G06F 1/187* (2013.01)
USPC . 361/679.58; 361/730; 361/732; 361/679.43; 174/535; 174/537; 174/542

(58) Field of Classification Search
CPC ......... G06F 1/181; G06F 1/183; G06F 1/184; G06F 1/185; G06F 1/187; G06F 1/188; G06F 1/1616; G06F 1/1626; G06F 1/1632; G06F 1/1656; G06F 1/1679; G11B 33/124; G11B 33/128; G11B 33/08; G11B 33/022; G11B 25/043; E05B 73/0082; H05K 7/1411; H05K 7/1409; H05K 7/02; H05K 5/0021; H05K 3/301; H05K 7/1488; H05K 7/18; H01L 23/5385; H01L 2924/01079; H01L 2924/15311; H01L 2924/14; H01L 2924/01013; H01L 2924/3011; H01L 2924/01078; H01L 2924/16195; H01L 2224/16; H01L 2224/48091; H01L 2224/48247; H01L 23/49575; H01L 23/4951; H02G 3/16; F21V 23/02; F21Y 2103/00
USPC ............ 361/679.31, 679.33–679.39, 679.43, 361/679.58, 724–727, 730, 732; 174/535, 174/537, 541, 542; 312/223.1, 223.2, 333; 211/41.1, 41.11, 41.12, 192, 193, 26, 211/189, 26.2, 184; 248/298.1
See application file for complete search history.

(56) References Cited

U.S. PATENT DOCUMENTS

| | | | | |
|---|---|---|---|---|
| 6,129,429 A | * | 10/2000 | Hardt et al. | 312/223.2 |
| 8,047,383 B2 | * | 11/2011 | Hendrix et al. | 211/26 |
| 2008/0310123 A1 | * | 12/2008 | Sherrod et al. | 361/725 |
| 2009/0194490 A1 | * | 8/2009 | Chen | 211/41.12 |

* cited by examiner

*Primary Examiner* — Lisa Lea Edmonds
*Assistant Examiner* — Christopher L Augustin
(74) *Attorney, Agent, or Firm* — Shook Hardy & Bacon LLP

(57) ABSTRACT

A casing includes a casing module and a support module. The casing module includes two side plates spaced apart from each other, a top-plate unit disposed between and perpendicular to the side plates, and a bottom plate spaced apart from and parallel to the top-plate unit. The side plates, the top-plate unit and the bottom plate define a first accommodating space for receiving a first electronic device. The support module is disposed between the top-plate unit and the bottom plate, and is removably caught in the top-plate unit to divide the first accommodating space into two second accommodating spaces for receiving two second electronic devices that differ in size from the first electronic device.

14 Claims, 11 Drawing Sheets

CASING AND SERVER USING THE SAME

CROSS-REFERENCE TO RELATED APPLICATION

This application claims priority of China Patent Application No. 201110190795.3, filed on Jul. 8, 2011, the disclosure of which is incorporated herein by reference.

BACKGROUND OF THE INVENTION

1. Field of the Invention

The invention relates to a casing of a server, and more particularly to a casing of a 2U server.

2. Description of the Related Art

Conventional servers are classified into 1U servers, 2U servers, 4U servers, and 5U servers according to the size of a casing of the servers. A conventional casing of the 2U servers has a dimension of about 651×480×88.4 (Unit: mm). The conventional casing of the 2U servers has two different structural designs. In one of the two structural designs, the casing is configured for accommodating 12 3.5-inch hard disks, that is to say, the casing is divided into 12 accommodating spaces for receiving the hard disks therein, respectively. In the other one of the two structural designs of the casing, the support plates among 4 of the accommodating spaces are removed, such that the 4 accommodating spaces are in spatial communication with one another and are configured for receiving one optical disk drive (ODD) module or one tape module therein.

Such conventional casings for the 2U servers may be used for the servers with two different configurations, i.e., one configuration of 12 3.5-inch hard disks and the other configuration of 8 3.5-inch hard disks as well as 1 ODD module or tape module, only through two different structural designs, respectively. There is a disadvantage that, one casing cannot be used for the servers with the two different configurations. That is to say, when one casing is used for installing 12 hard disks therein, a part of the support plates have to be removed to obtain enough accommodating space to accommodate the ODD module or tape module while it is intended to install 8 hard disks with 1 ODD module or 1 tape module. However, after the support plates are removed, the casing cannot be changed to once again accommodate 12 hard disks. Thus, the conventional casing is less flexible, resulting in inconvenience in use.

SUMMARY OF THE INVENTION

Therefore, an object of the present invention is to provide a casing capable of receiving three different configurations of 2U servers.

A casing of the present invention is for optionally receiving a first electronic device and a second electronic device with different sizes. The casing comprises a casing module and a support module.

The casing module includes two side plates spaced apart from each other, a top-plate unit disposed between and perpendicular to the side plates, and a bottom plate spaced apart from and parallel to the top-plate unit. The two side plates, the top-plate unit and the bottom plate cooperatively define a first accommodating space and an opening to communicate spatially the first accommodating space with an exterior of the casing module. The first accommodating space is configured to receive the first electronic device therein. The top-plate unit has a first positioning part and a blocking part. The bottom plate is formed with a second positioning part disposed below and corresponding to the first positioning part.

The support module includes a support member and a catching member disposed on the support member. The support member is disposed between the first positioning part and the second positioning part. The catching member is removably caught by the blocking part to removably position the support module between the top-plate unit and the bottom plate, and to divide the first accommodating space of the casing module into two second accommodating spaces. Each of the second accommodating spaces is configured to accommodate at least one of the second electronic devices. The catching member is detachably blocked by the blocking part to prevent the support member from moving toward the opening.

The first positioning part includes a first positioning groove formed in the top-plate unit, and the second positioning part includes a second positioning groove formed in the bottom plate. The support member has a top edge and a bottom edge respectively extending into the first positioning groove and the second positioning groove. The support member is located between the side plates.

The top-plate unit includes a top plate having two ends respectively connected to top ends of the two side plates, and two positioning plates extending downwardly from the top plate and spaced apart from each other. The positioning plates cooperatively define the first positioning groove therebetween.

The top-plate unit further includes a partition plate that is located between the top plate and the bottom plate and that is formed with a plurality of positioning through holes. Each of the positioning plates includes a plurality of hooks. The support member includes a stand part, and a side protruding part protruding from the stand part and extending along a depth direction with respect to the opening. A number of the hooks of the positioning plates respectively pass through a number of the positioning holes to hook to the partition plate and cooperatively define the first positioning groove, and others of the hooks hook to the side protruding part.

The support member includes two support plates fixedly connected to each other. Each of the support plates has a stand plate body, an upper protrusion extending outwardly from the stand plate body, and a plurality of middle ribs protruding from the stand plate body and extending along the depth direction. The catching member is pivotally disposed between the support plates and is resiliently biased to protrude out of the support plates upwardly.

The support module further includes a spring disposed between the support plates, and the catching member is biased by the spring and has a catching part that is configured to resiliently and upwardly protrude out of the support plates and that engages the blocking part.

Each of the support plates further includes an upper protruding plate engaging the first positioning groove, and a lower protruding plate engaging the second positioning groove.

The support plates are formed with respective through holes that are registered and in spatial communication with each other. The catching member is exposed from the through holes, and is retracted into the catching part between the support plates upon exertion of a force thereon through the through holes.

The catching member has one end pivotally disposed between the support plates and another end where the catching part is disposed.

The catching part is formed with an L-shaped notch configured to engage the blocking part.

Another object of the present invention is to provide a server with a casing capable of receiving different configurations of the server.

Accordingly, a server of this invention comprises a first electronic device, a second electronic device, and a casing. The second electronic device has a size different from a size of said first electronic device. The casing includes a casing module and a support module.

The casing module includes two side plates spaced apart from each other, a top-plate unit disposed between and perpendicular to the side plates, and a bottom plate spaced apart from and parallel to the top-plate unit. The two side plates, the top-plate unit and the bottom plate cooperatively define a first accommodating space and an opening to communicate spatially the first accommodating space with an exterior of the casing module. The first accommodating space is configured to receive the first electronic device therein. The top-plate unit has a first positioning part and a blocking part. The bottom plate is formed with a second positioning part disposed below and corresponding to the first positioning part.

The support module includes a support member and a catching member disposed on the support member. The support member is disposed between the first positioning part and the second positioning part. The catching member is removably caught by the blocking part to removably position the support module between the top-plate unit and the bottom plate, and to divide the first accommodating space of the casing module into two second accommodating spaces. Each of the second accommodating spaces is configured to accommodate at least one of the second electronic devices. The catching member is detachably blocked by the blocking part to prevent the support member from moving toward the opening. The effect of the present invention is in that, the casing is configured for accommodating a plurality of second electronic devices when the support module is installed within the casing module, and is adapted for accommodating the second electronic devices and one first electronic device when the support module is removed, such that the casing of this invention is capable of supporting three different configurations of the 2U servers.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE EMBODIMENT

Figure 1:
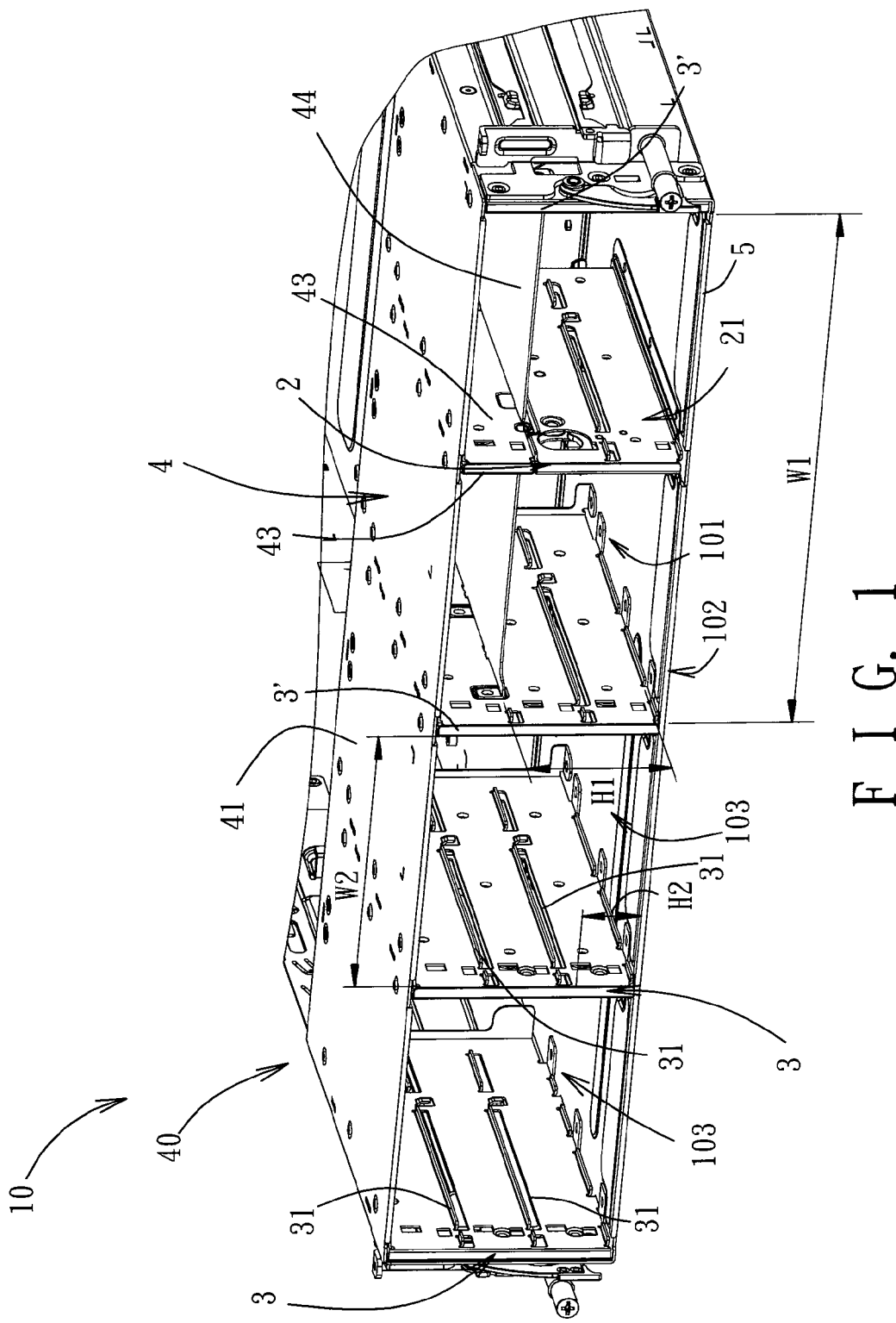
FIG. 1 is a perspective view of an embodiment of a casing according to the present invention.
Figure 2:
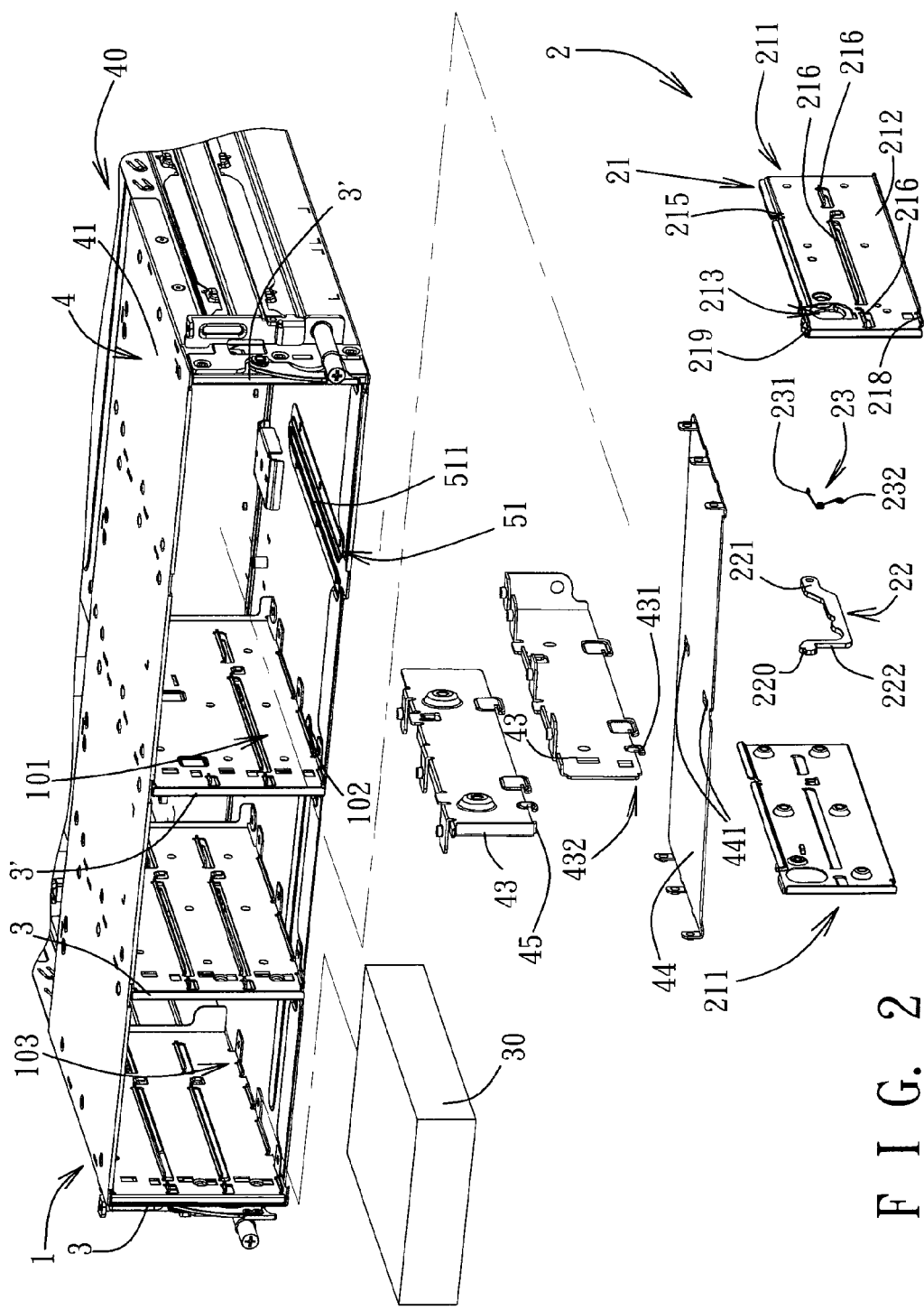
FIG. 2 is an exploded perspective view illustrating assembly relationship between the casing of the embodiment and a second electronic device.
Figure 8:
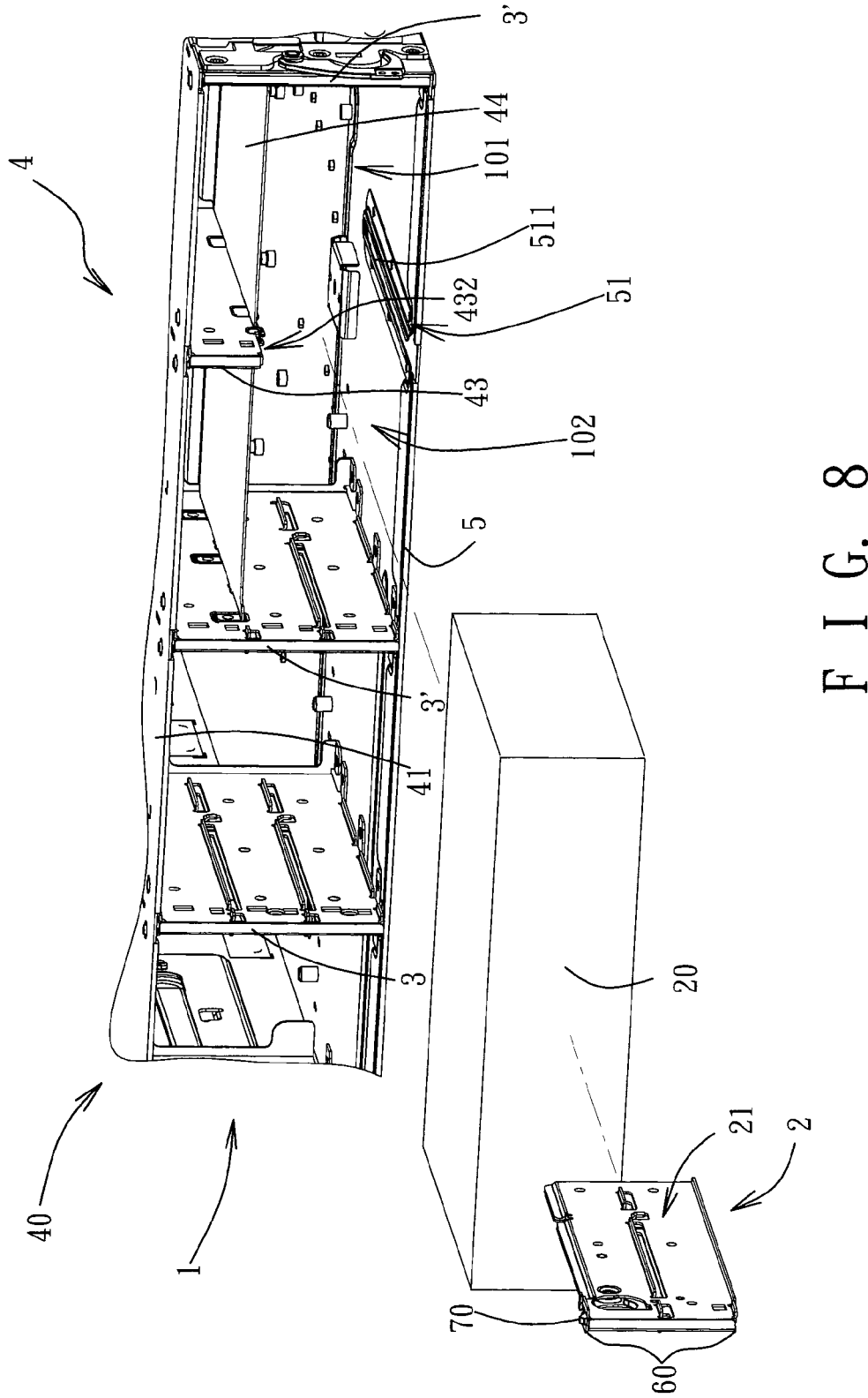
FIG. 8 and FIG. 9 are schematic fragmentary perspective views illustrating the assembly relationship between the support module and a casing module of the casing according to the embodiment.

Referring to FIGS. 1 and 2, an embodiment of a casing 40 of the present invention is a frame for a server 10. The server 10 includes a first electronic device 20 (as shown in FIG. 8) and a plurality of second electronic devices 30. The first electronic device 20 has a width different from that of each of the second electronic devices 30. The first electronic device 20 may be a tape module or an optical disk drive (ODD) module, and has a first width (W1) and a first height (H1). Each of the second electronic devices 30 is a 3.5-inch hard disk, and has a second width (W2) and a second height (H2). The first width (W1) is twice as large as the second width (W2), and the first height (H1) is twice as large as the second height (H2).

The casing 40 comprises a casing module 1 and a support module 2. The casing module 1 includes four side plates 3 and 3' spaced apart from one another from left to right, a top-plate unit 4 perpendicularly disposed above and connected to the side plates 3 and 3', and a bottom plate 5 connected to a bottom end of each of the side plates 3, 3' and parallel to the top-plate unit 4. The top-plate unit 4 has a top plate 41 connected to a top end of each of the side plates 3, 3'. The side plates 3' are spaced apart from each other by a distance equal to the first width (W1). The side plates 3', the top-plate unit 4 and the bottom plate 5 cooperatively define a first accommodating space 101 and an opening 102 to communicate spatially the first accommodating space 101 with an exterior of the casing module 1. A height of each of the side plates 3 and 3' from the top plate 41 of the top-plate unit 4 to the bottom plate 5 is 1.5 times as high as the first height (H1). Each of the side plates 3 has two supporting ribs 31 respectively extending along a depth direction with respect to the opening 102 and spaced apart from each other from top to bottom. The supporting ribs 31 of the two side plates 3 are aligned with each other, respectively. The distance between the two supporting ribs 31 of each side plate 3, the distance between the upper one of the supporting ribs 31 and the top plate 41, and the distance between the lower one of the supporting ribs 31 and the bottom plate 5 are all equal to the second height (H2).

Figure 11:
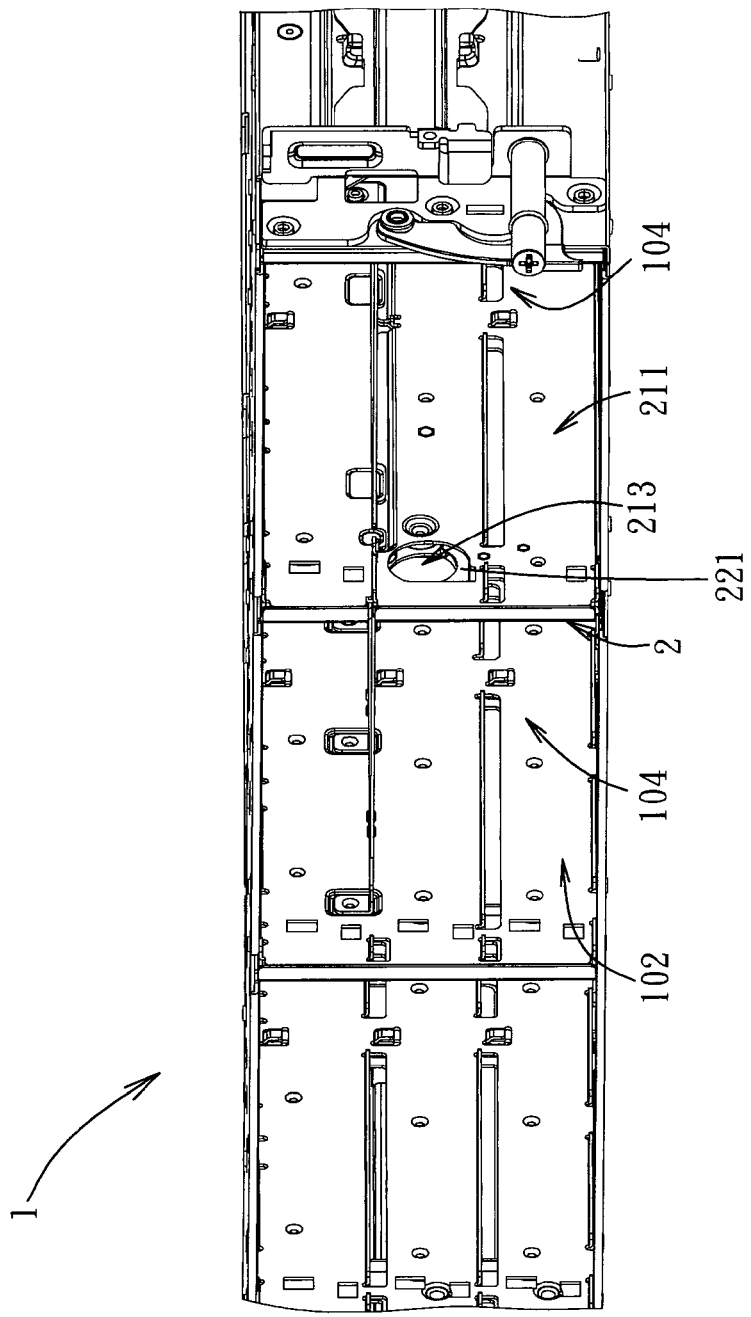
FIG. 11 is a schematic perspective view illustrating the second accommodating spaces according to the embodiment.

The first electronic device 20 (as shown in FIG. 8) is configured to be placed into the first accommodating space 101 through the opening 102. When it is intended to dispose the second electronic devices 30, the support module 2 can be mounted between the top-plate unit 4 and the bottom plate 5, so that the first accommodating space 101 is divided into two second accommodating spaces 104 each of which is located between the support module 2 and a respective one of the side plates 3' and has a width equal to the second width W2 (as shown in FIG. 11). In this case, each of the second accommodating spaces 104 is configured to accommodate two of the second electronic devices 30. Further details of the support module 2 will be described later. The other two of the side plates 3 are spaced apart from each other and disposed between the top plate 41 and the bottom plate 5. The side plates 3, a corresponding one of the side plates 3', the bottom plate 5 and the top plate 41 cooperatively define two receiving spaces 103. Each of the receiving spaces 103 also has a width equal to the second width (W2) of the second electronic devices 30. Each of the receiving spaces 103 has a height that is consistent with a summation of the heights of three of the second electronic devices 30. Thus, each of the receiving spaces 103 is configured to receive three of the second electronic devices 30 therein.

Figure 3:
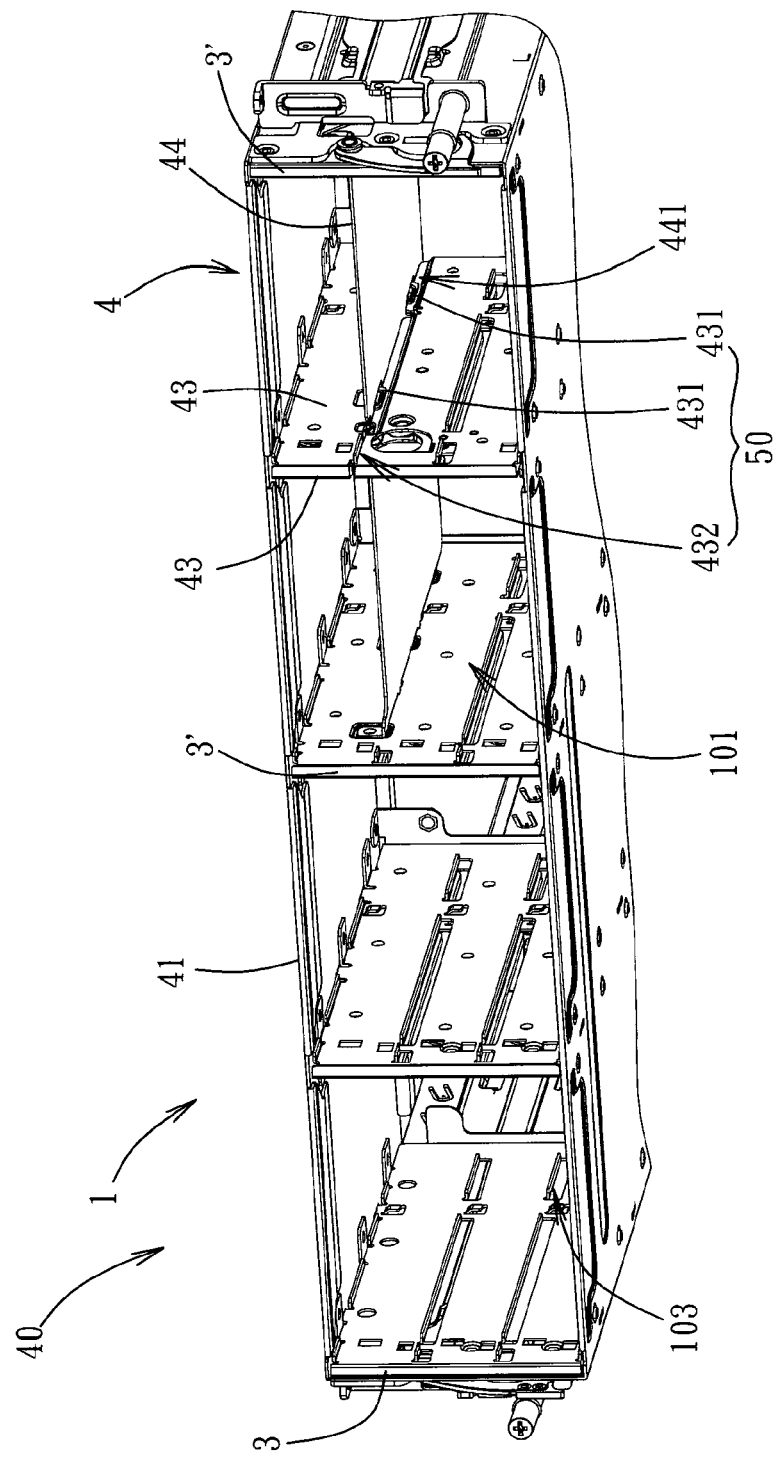
FIG. 3 is a perspective view illustrating a top-plate unit of the casing of embodiment.
Figure 4:
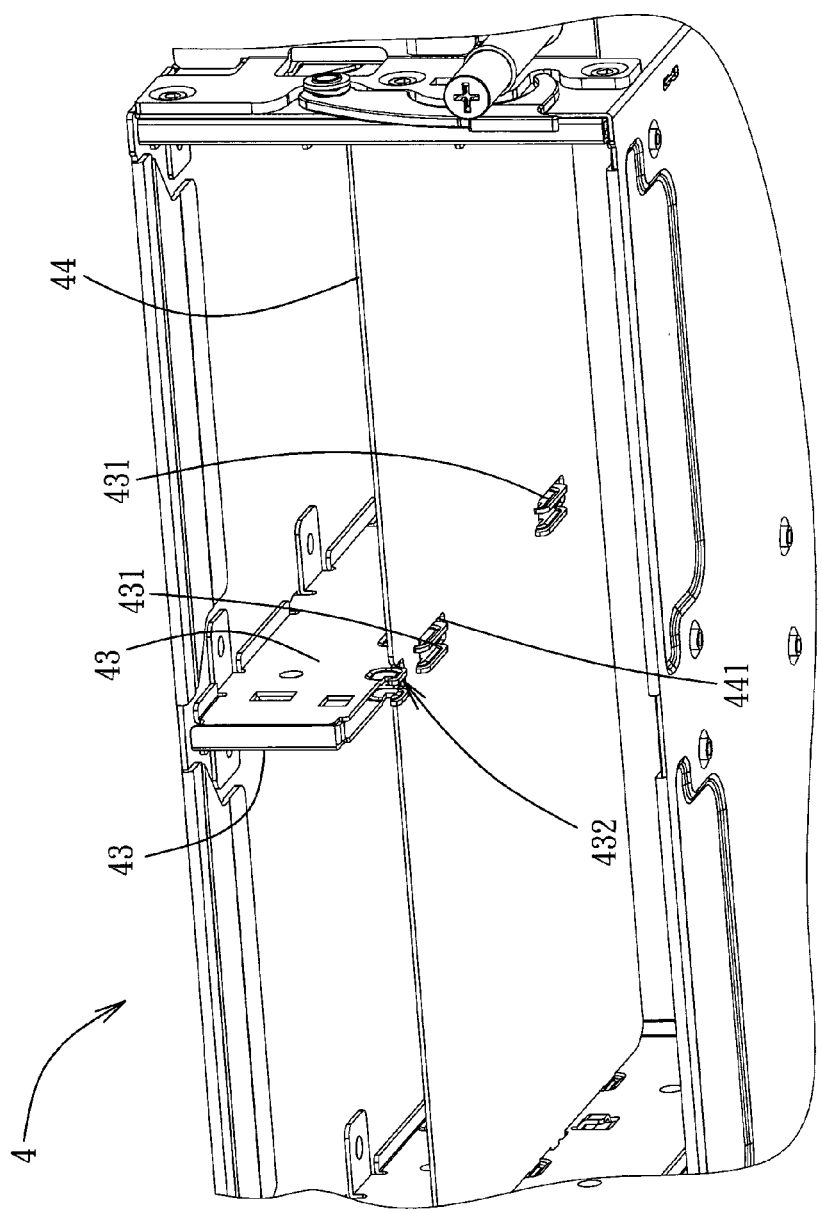
FIG. 4 is an enlarged fragmentary perspective view illustrating a support module of the casing of the embodiment.

Referring to FIGS. 2, 3 and 4, the top-plate unit 4 further has two positioning plates 43, a partition plate 44, and a blocking part 45. The positioning plates 43 extend downwardly from the top plate 41, and are spaced apart from each other from left to right. The partition plate 44 is attached to the positioning plates 43, and located below the top plate 41. More specifically, the partition plate 44 is formed with a plurality of positioning through holes 441. Each of the positioning plates 43 has a plurality of hooks 431 formed at a bottom edge. The hooks 431 cooperatively define a first positioning part 50 of the top-plate unit 4. The positioning plates 43 are attached to the partition plate 44 by the hooks 431 downwardly passing through the positioning through holes 441 of the partition plate 44 to hook to a bottom side of the partition plate 44. Thus, the hooks 431 of the positioning plates 43 protrude downwardly below the partition plate 44. In addition, since the positioning plates 43 are spaced apart from each other from left to right, a first positioning groove 432 extending along the depth direction (that is, a front-to-rear direction) is defined between the hooks 431 of the positioning plates 43. The function of the first positioning groove 432 will be described later. The bottom plate 5 also has a second positioning part 51 corresponding to the first positioning groove 432 and located below the first positioning groove 432. The second positioning part 51 has a second positioning groove 511.

Referring to FIGS. 2, 3, and 4, left and right side edges of the partition plate 44 are respectively connected to the side plates 3'. The foremost pair of the hooks 431 of the positioning plates 43 do not hook to the positioning through holes 441 of the partition plate 44. The function of the foremost pair of the hooks 431 will be described later. Thus, the first positioning part 50 defined by the hooks 431 of the positioning plates 43 includes the first positioning groove 432 and the pair of the hooks 431 that do not hook to the partition plate 44.

In this embodiment, the distance between the top plate 41 and the partition plate 44 of the top-plate unit 4 is equal to the second height (H2). The distance between each of the positioning plates 43 and a corresponding one of the side plates 3' is twice as long as the second width (W2). Thus, the top plate 41, the partition plate 44, each of the positioning plates 43, and the corresponding one of the side plates 3' cooperatively define a space suitable for accommodating one of the second electronic devices 30.

Figure 6:
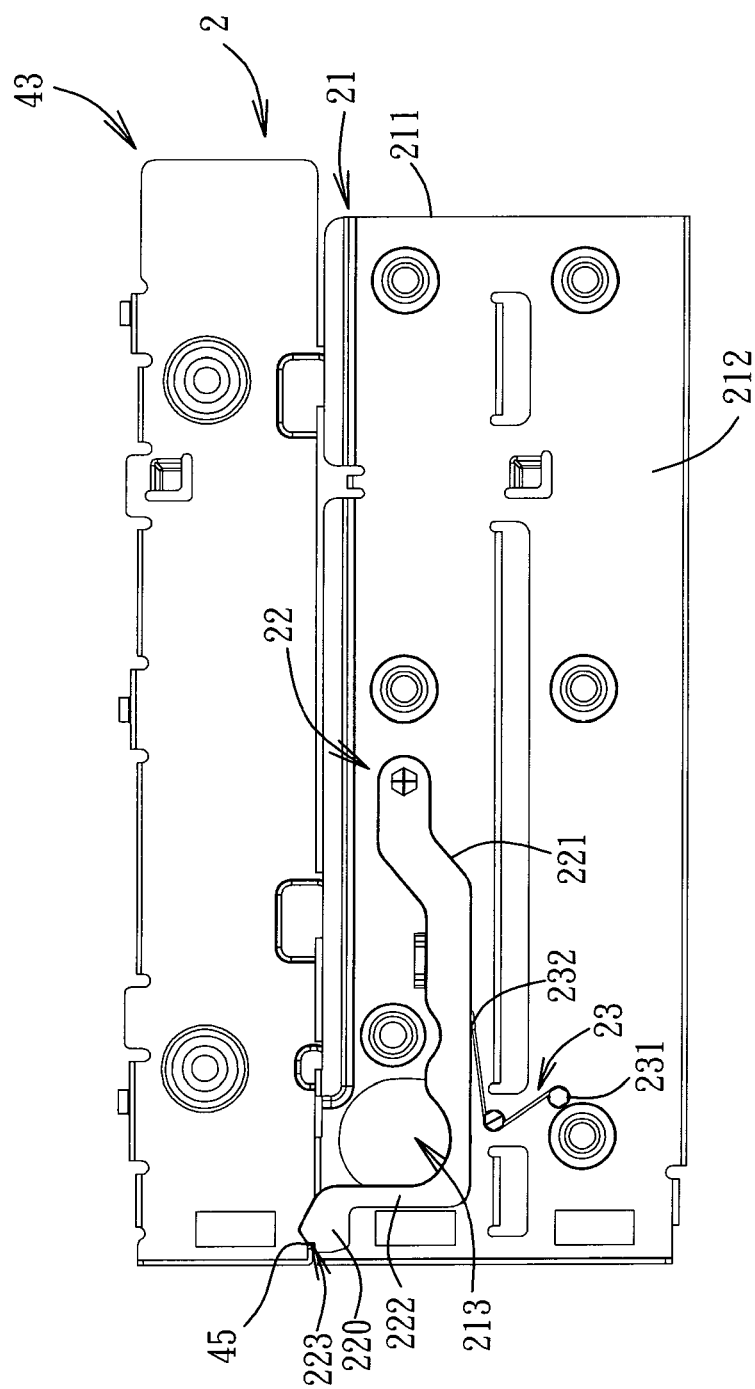

Referring to FIGS. 4 and 6, the blocking part 45 is located between bottom edges of the positioning plates 43, and is adjacent to front edges of the positioning plates 43. In this embodiment, the blocking part 45 is a stop tab integrally connected to one of the positioning plates 43 and extending along the depth direction with respect to the positioning plate 43.

Figure 5:
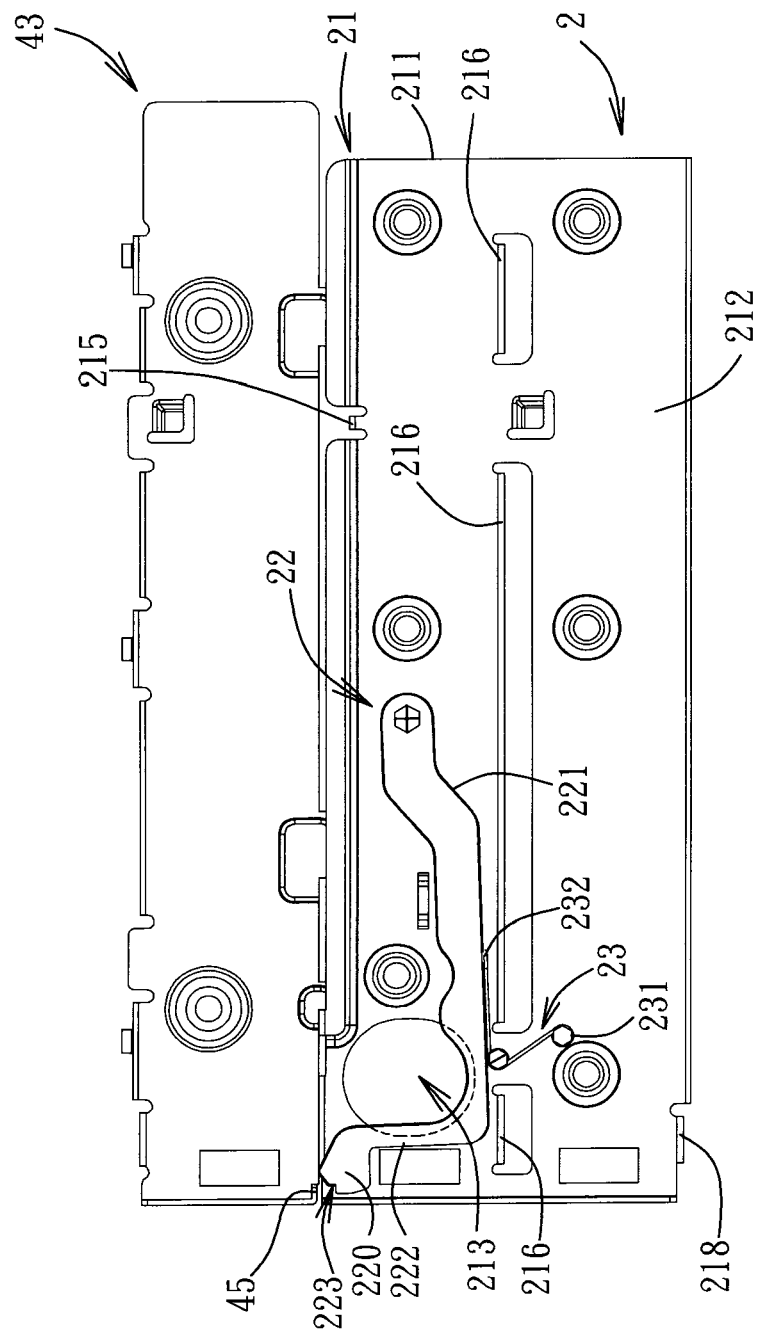
FIG. 5 and FIG. 6 are schematic side views illustrating movement of the support module according to the embodiment.

Referring to FIGS. 2, 3, and 5, the support module 2 includes a support member 21, a catching member 22 disposed at the support member 21, and a spring 23.

The support member 21 has two support plates 211 that are joined with each other from left to right. Each of the support plates 211 has a stand plate body 212, an upper protrusion 215 extending outwardly from the stand plate body 212, a plurality of middle ribs 216 protruding outwardly from the stand plate body 212 and extending along the depth direction, a lower protruding plate 218, and an upper protruding plate 219. The stand plate bodies 212 of the support plates 211 are joined from left to right, and the upper protrusion 215, the middle ribs 216, the lower protruding plate 218, and the upper protruding plate 219 of one of the stand plate bodies 212 extend away from those of the other one of the stand plate bodies 212, respectively. In this embodiment, parts of the top edges of the two stand plate bodies 212 are attached to each other, and portions of the two stand plate bodies 212 below the top edges are spaced apart from each other and have a width greater than a width of the top edges. Each of the stand plate bodies 212 is formed with a through hole 213. The through holes 213 of the stand plate bodies 212 are adjacent to the front edges of the stand plate bodies 212 and are in spatial communication with each other. The upper protruding plate 219 is adjacent to the top edges and the front edges of the stand plate bodies 212. The middle ribs 216 are sheet-shaped, extend along the depth direction, and are located at approximately half the height of the stand plate body 212. The upper protrusion 215 is located between the top edge of the stand plate body 212 and the middle ribs 216, and is spaced apart from the middle ribs 216 by a distance of the second height (H2) (as shown in FIG. 1). The lower protruding plate 218 is located between the bottom edge of the stand plate body 212 and the middle ribs 216, and is spaced apart from the middle ribs 216 by a distance of the second height (H2) as well.

Figure 7:
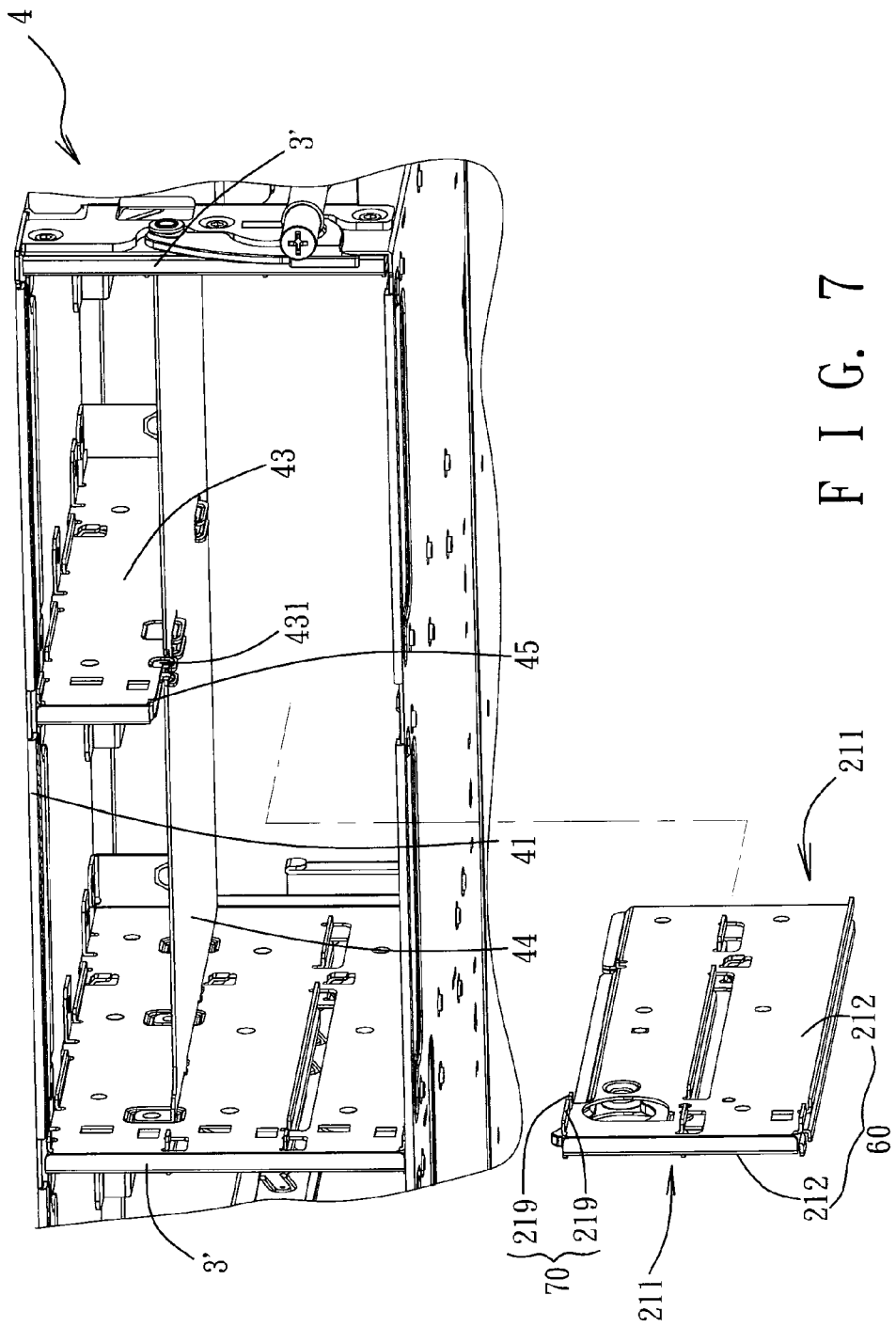
FIG. 7 is a schematic fragmentary perspective view illustrating the support module according to the embodiment.

Referring to FIGS. 2 and 7, as a whole, the stand plate bodies 212 of the support plates 211 can be considered as a stand part 60, and the upper protruding plates 219 of the support plates 211 can also be considered as a side protruding part 70. In other embodiments, the support member 21 may not include two joined support plates 212, and may alternatively be a single plate structure including the stand part 60 and the side protruding part 70.

Referring to FIGS. 2, 5, and 6, the catching member 22 is disposed in a space below the top edges of the stand plate bodies 212 of the support plates 211 where a distance between the stand plate bodies 212 is greater than the width of the top edges. The catching member 22 is substantially L-shaped. More specifically, the catching member 22 includes a catching part 220, a pivoting arm 221 pivotally disposed between the stand plate bodies 212, and a connecting arm 222 connected between the catching part 220 and the pivoting arm 221. The pivoting arm 221 extends along the depth direction, and the connecting arm 222 extends from bottom to top. The catching part 220 is located at an upper end of the connecting arm 222, and has a forward L-shaped notch 223. The catching member 22 is pivotally disposed between the stand plate bodies 212 by pivoting a free end of the pivoting arm 221 (i.e., a rear end opposite to the connecting arm 222) to the stand plate bodies 212. The connecting arm 222 extends upward from a front end of the pivoting arm 221 opposite to the free end, such that the catching part 220 is exposed out of parts of the top edges of the two stand plate bodies 212 that are not be attached to each other.

The spring 23 is disposed below the catching member 22, and has a fixed end 231 connected to the support member 21 and an abutting end 232 abutting against the pivoting arm 221 of the catching member 22. By virtue of the spring 23 upwardly abutting against and biasing the catching member 22, a part of the pivoting arm 221 is exposed from the through holes 213 of the stand plate bodies 212, and the catching part 220 resiliently and upwardly protrudes out of the top edges of the stand plate bodies 212. The through holes 213 allows an object (e.g., fingers) to be placed therein and to press the pivoting arm 221 downwardly. As such, when the pivoting arm 221 is pressed, the pivoting arm 221 is displaced downwardly in association with the connecting arm 222 to compress the spring 23 (as shown in FIG. 5), so that the spring 23 accumulates a resilient biasing force and the catching part 220 retracts downwardly between the top edges of the stand plate bodies 212.

Referring to FIGS. 2 and 8, as described above, when the support module 2 is not mounted between the top-plate unit 4 and the bottom plate 5, the first accommodating space 101 may accommodate the first electronic device 20. When a user intends to change the first accommodating space 101 into a space for accommodating the second electronic devices 30, a top edge and a bottom edge of the support member 21 of the support module 2 are respectively slid into the first positioning groove 432 (as shown in FIG. 4) and the second positioning groove 51, so that the support module 2 is moved into the first accommodating space 101. By virtue of the first positioning groove 432 and the second positioning groove 51, the support module 2 will not horizontally offset during sliding into the first accommodating space 101.

Figure 9:
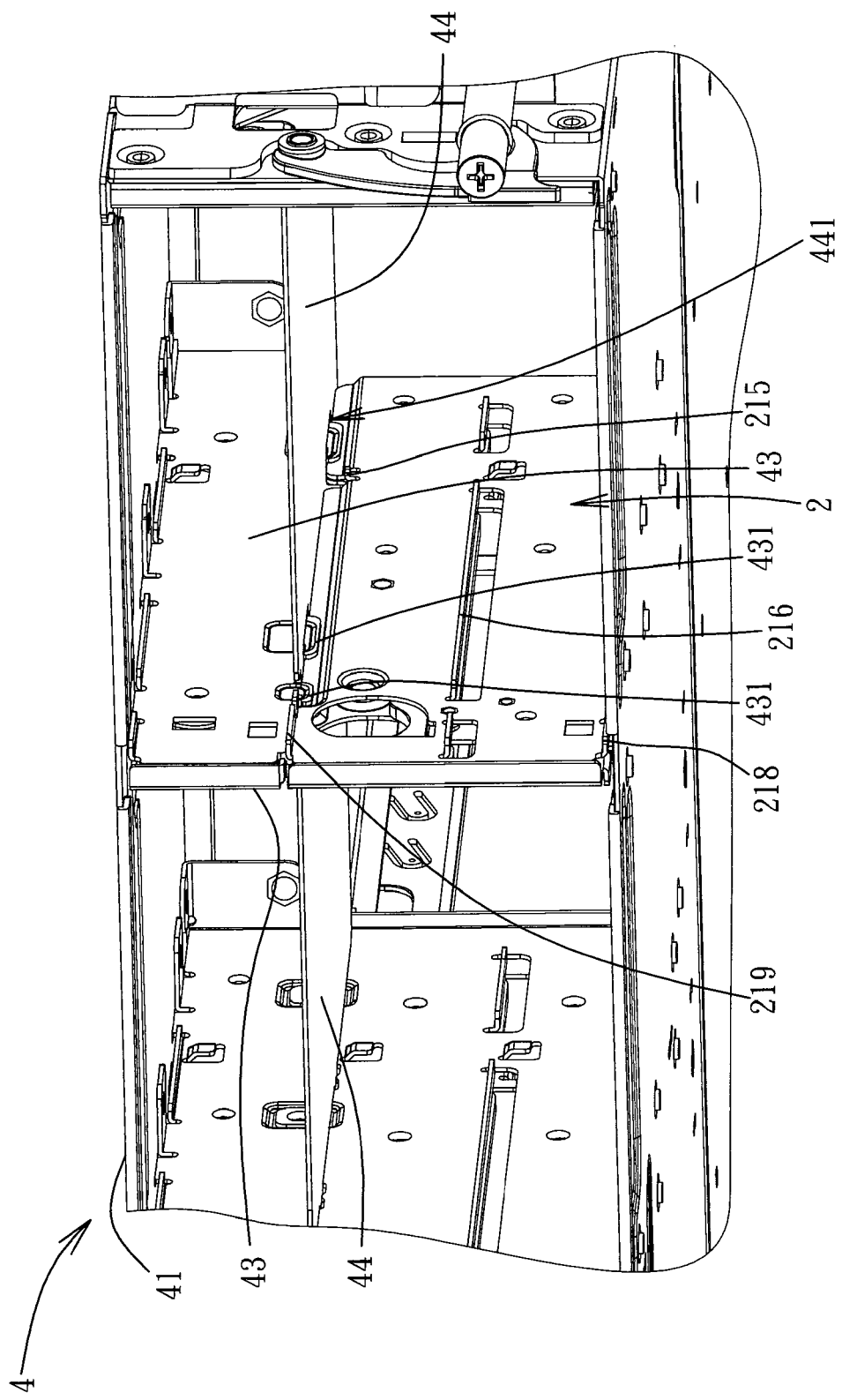
Figure 10:
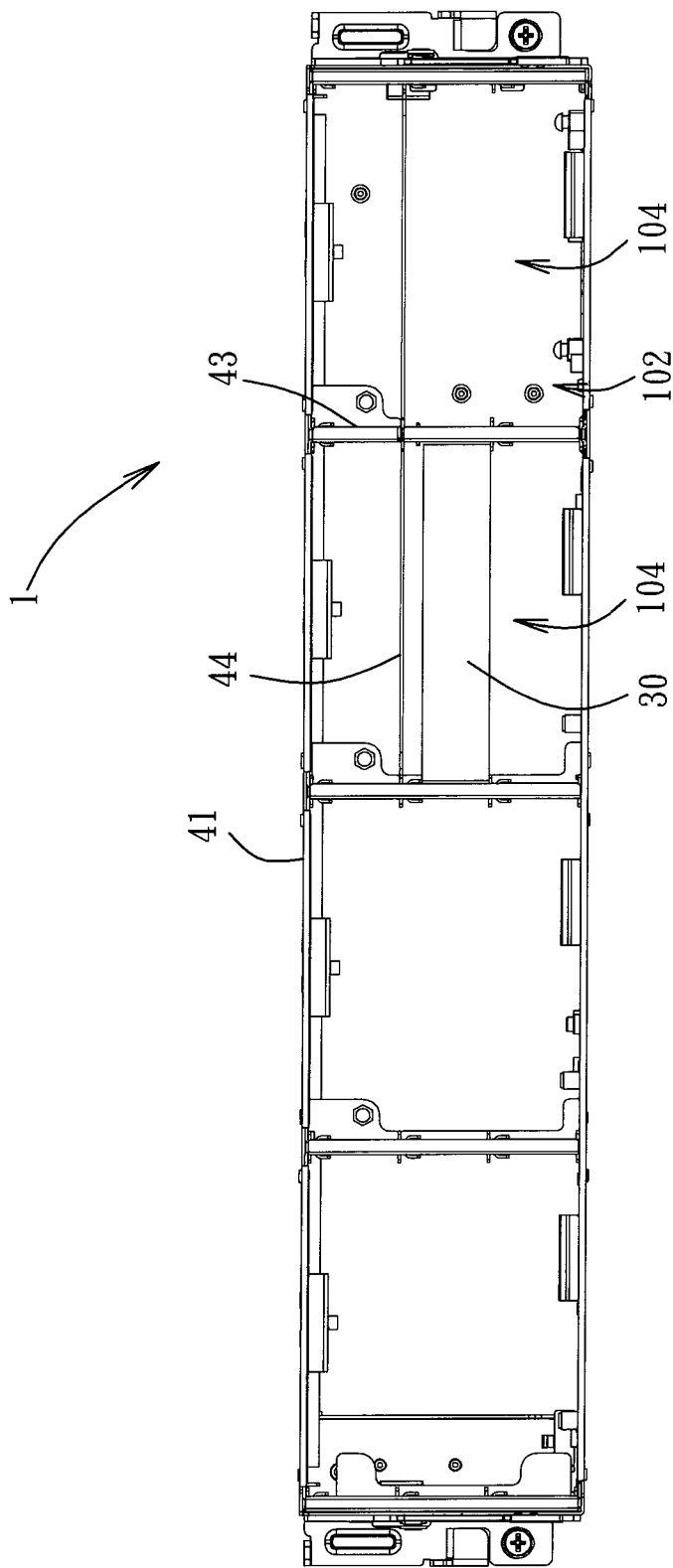
FIG. 10 is a front view illustrating two second accommodating spaces according to the embodiment.

Referring to FIGS. 5, 6, and 9, when the support module 2 is further pushed to make the catching part 220 abut against the blocking part 45, the catching part 220 is pressed by the blocking part 45 such that the catching member 22 pivots downwardly to retract between the two support plates 211 to thereby compress the spring 23. When the support module 2 is located at an assembled position, the spring 23 pushes the catching member 22 upwardly to protrude the catching part 220 out of the support plates 211 again. At this time, the notch 223 of the catching part 220 engages the blocking part 45 such that the support module 2 is positioned at the assembled position without sliding through the opening 102. Referring to FIG. 9, in the assembled position, the foremost pair of the hooks 431 of the positioning plates 43 hook to the upper protruding plates 219 of the support plates 211, respectively. As such, the support module 2 divides the first accommodating space 101 of the casing module 1 into two second accommodating spaces 104 (as shown in FIG. 10). Each of the second accommodating spaces 104 allows two of the second electronic devices 30 (as shown in FIG. 2) to be disposed therein. More specifically, the two second electronic devices 30 disposed in one of the second accommodating spaces 104 are respectively supported at a position between the middle ribs 216 and the upper protrusion 215, and a position between the middle ribs 216 and the lower protruding plate 218.

Referring to FIGS. 1 and 2, it should be noted that, the two receiving spaces 103 can receive 6 of the second electronic devices 30 in this embodiment. Further, by virtue of the positioning plate 43 and the partition plate 44 of the top-plate unit 4, two of the second electronic devices 30 can be disposed above the partition plate 44. Moreover, the support module 2 can be smoothly slid into the casing module 1 through the first positioning groove 432 of the positioning plate 43 (as shown in FIG. 4) and the second positioning groove 51 of the bottom plate 5, and can be positioned at the assembled position, while preventing the support module 2 from offset leftward and rightward. Referring to FIGS. 2, 9 and 10, when the support module 2 is positioned at the assembled position, the first accommodating space 101 is divided into two second accommodating spaces 104. Since each support plate 211 is designed with the upper protrusion 215, the middle ribs 216 and the lower protruding plate 218, each of the second accommodating spaces 104 can be stably provided with two second electronic devices 30 over and under the middle ribs 216, respectively. In this way, the casing module 1 is totally provided with 12 second electronic devices 30. Certainly, the configuration of the casing module 1 is not limited to this embodiment. In other embodiments, by designing a width and a length of the casing module 1, the casing module 1 can accommodate more second electronic devices 30.

Furthermore, when the support module 2 is disposed at the assembled position in the casing module 1, the upper protruding plate 219 and the lower protruding plate 218 of the support plates 211 are respectively engaged with the first positioning groove 432 (as shown in FIG. 4) and the second positioning groove 51, to prevent the support module 2 from further moving toward the depth direction with respect to the casing module 1. Meanwhile, the catching part 220 abuts against the blocking part 45 to restrict the support module 2 from moving out of the first accommodating space 101 through the opening 102, to thereby stably position the support module 2 within the casing module 1.

Referring to FIGS. 6, 8 and 11, when a user intends to remove the support module 2 from the casing module 1, the user presses the pivoting arm 221 of the catching member 22 through the through holes 213 of the support plates 211, to disengage the catching part 220 from the blocking part 45 (as shown in FIG. 5), and pulls out the support module 2 from the opening 102. As a result, the two second accommodating spaces 104 once again form the first accommodating space 101, and thus the first electronic device 20 can be moved into the first accommodating space 101.

To sum up, in the present invention, by disposing the removable support module 2 in the casing module 1, the casing module 1 is allowed to accommodate 12 hard disks. When the support module 2 is removed from the casing module 1, the casing module 1 can accommodate 8 hard disks and 1 tape disk or ODD disk. In this way, the casing module 1 is configured to accommodate servers with different configurations, and thus, the casing module 1 can be used flexibly.

While the present invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A casing for optionally receiving a first electronic device and a second electronic device with different sizes, said casing comprising:

a casing module including two side plates spaced apart from each other, a top-plate unit disposed between and perpendicular to said side plates, and a bottom plate spaced apart from and parallel to said top-plate unit, said side plates, said top-plate unit and said bottom plate cooperatively defining a first accommodating space and an opening to communicate spatially said first accommodating space with an exterior of said casing module, said first accommodating space being configured to receive the first electronic device therein, said top-plate unit having a first positioning part that includes a first positioning groove formed in said top-plate unit and a blocking part, said bottom plate being formed with a second positioning part that is disposed below and corresponds to said first positioning part and that includes a second positioning groove formed in said bottom plate; and a support module including a support member and a catching member disposed on said support member, said support member being disposed between said first positioning part and said second positioning part, extending into said first positioning groove and said second positioning groove, and being located between said side plates, said catching member being removably caught by said blocking part to removably position said support module between said top-plate unit and said bottom plate and to divide said first accommodating space of said casing module into two second accommodating spaces, each of said second accommodating spaces being configured to accommodate at least one of the second electronic devices, said catching member being detachably blocked by said blocking part to prevent said support member from moving toward said opening;

wherein said top-plate unit includes a top plate having two ends respectively connected to top ends of said two side plates, and two positioning plates extending downwardly from said top plate and spaced apart from each other, said positioning plates cooperatively defining said first positioning groove therebetween;

wherein said top-plate unit further includes a partition plate that is located between said top plate and said bottom plate and that is formed with a plurality of positioning through holes, each of said positioning plates including a plurality of hooks, said support member including a stand part and a side protruding part protruding from said stand part and extending along a depth direction with respect to said opening, a number of said hooks of said positioning plates respectively passing through a number of said positioning holes to hook to said partition plate and cooperatively defining said first positioning groove, others of said hooks hooking to said side protruding part.

2. The casing of claim 1, wherein said support member includes two support plates fixedly connected to each other, each of said support plates having a stand plate body, an upper protrusion extending outwardly from said stand plate body, and a plurality of middle ribs protruding from said stand plate body and extending along the depth direction, said catching member being pivotally disposed between said support plates and being resiliently biased to protrude out of said support plates upwardly.

3. The casing of claim 2, wherein said support module further includes a spring disposed between said support plates, said catching member being biased by said spring and having a catching part that is configured to resiliently and upwardly protrude out of said support plates and that engages said blocking part.

4. The casing of claim 2, wherein each of said support plates further includes an upper protruding plate engaging said first positioning groove and a lower protruding plate engaging said second positioning groove.

5. The casing of claim 2, wherein said support plates are formed with respective through holes that are registered to and in spatial communication with each other, said catching member being exposed from said through holes, and being retracted into said catching part between said support plates upon exertion of a force thereon through said through holes.

6. The casing of claim 5, wherein said catching member has one end pivotally disposed between said support plates and another end where said catching part is disposed.

7. The casing of claim 3, wherein said catching part is formed with an L-shaped notch configured to engage said blocking part.

8. A server comprising:
a first electronic device;
a second electronic device having a size different from a size of said first electronic device; and
a casing including a casing module including two side plates spaced apart from each other, a top-plate unit disposed between and perpendicular to said side plates, and a bottom plate spaced apart from and parallel to said top-plate unit, said side plates, said top-plate unit and said bottom plate cooperatively defining a first accommodating space and an opening to communicate spatially said first accommodating space with an exterior of said casing module, said first accommodating space being configured to receive said first electronic device therein, said top-plate unit having a first positioning part that includes a first positioning groove formed in said too-plate unit and a blocking part, said bottom plate being formed with a second positioning part that is disposed below and corresponds to said first positioning part and that includes a second positioning groove formed in said bottom plate, and a support module including a support member and a catching member disposed on said support member, said support member being disposed between said first positioning part and said second positioning part, extending into said first positioning groove and said second positioning groove, and being located between said side plates, said catching member being removably caught by said blocking part to removably position said support module between said top-plate unit and said bottom plate and to divide said first accommodating space of said casing module into two second accommodating spaces, each of said second accommodating spaces being configured to accommodate said second electronic device, said catching member being detachably blocked by said blocking part to prevent said support member from moving toward said opening;

wherein said top-plate unit includes a top plate having two ends respectively connected to top ends of said two side plates, and two positioning plates extending downwardly from said top plate and spaced apart from each other, said positioning plates cooperatively defining said first positioning groove therebetween;

wherein said top-plate unit further includes a partition plate that is located between said top plate and said bottom plate and that is formed with a plurality of positioning through holes, each of said positioning plates including a plurality of hooks, said support member including a stand part and a side protruding part protruding from said stand part and extending along a depth direction with respect to said opening, a number of said hooks of said positioning plates respectively passing through a number of said positioning holes to hook to said partition plate and cooperatively defining said first positioning groove, others of said hooks hooking to said side protruding part.

9. The server of claim 8, wherein said support member includes two support plates fixedly connected to each other, each of said support plates having a stand plate body, an upper protrusion extending outwardly from said stand plate body, and a plurality of middle ribs protruding from said stand plate body and extending along the depth direction, said catching member being pivotally disposed between said support plates and being resiliently biased to protrude out of said support plates upwardly.

10. The server of claim 9, wherein said support module further includes a spring disposed between said support plates, said catching member being biased by said spring and having a catching part that is configured to resiliently and upwardly protrude out of said support plates and that engages said blocking part.

11. The server of claim 9, wherein each of said support plates further includes an upper protruding plate engaging said first positioning groove and a lower protruding plate engaging said second positioning groove.

12. The server of claim 9, wherein said support plates are formed with respective through holes that are registered to and in spatial communication with each other, said catching member being exposed from said through holes, and being retracted into said catching part between said support plates upon exertion of a force thereon through said through holes.

13. The server of claim 12, wherein said catching member has one end pivotally disposed between said support plates and another end where said catching part is disposed.

14. The casing of claim 10, wherein said catching part is formed with an L-shaped notch configured to engage said blocking part.

* * * * *